United States Patent [19]

Tsukada et al.

[11] 4,142,160
[45] Feb. 27, 1979

[54] HETERO-STRUCTURE INJECTION LASER

[75] Inventors: Toshihisa Tsukada, Merima; Naoki Chinone, Kokubunji; Satoshi Nakamura; Ryoichi Ito, both of Hachioji, all of Japan

[73] Assignee: Hitachi, Ltd., Japan

[21] Appl. No.: 612,103

[22] Filed: Sep. 10, 1975
(Under 37 CFR 1.47)

Related U.S. Application Data

[63] Continuation of Ser. No. 339,919, Mar. 9, 1973, abandoned.

[30] Foreign Application Priority Data

Mar. 13, 1972 [JP] Japan .................................. 47-25644

[51] Int. Cl.[2] ................................................ H01S 3/19
[52] U.S. Cl. .................................. 331/94.5 H; 357/18; 357/56

[58] Field of Search ................... 331/94.5 H; 354/16, 354/18; 357/17, 55, 56

[56] References Cited

U.S. PATENT DOCUMENTS

| 3,551,842 | 12/1970 | Nelson | 331/94.5 H |
| 3,758,875 | 9/1973 | Hayashi | 331/94.5 H |

OTHER PUBLICATIONS

Kressel et al., Electronics, Mar. 16, 1970, pp. 78-86.
IEEE Int'l Electron Devices Meeting, Oct. 12 & 13, 1971, pp. 13-14.

Primary Examiner—John Zazworsky
Assistant Examiner—James W. Davie
Attorney, Agent, or Firm—Craig & Antonelli

[57] ABSTRACT

A semiconductor laser having a structure such that a narrow strip mesa is formed above a laser active layer in a hetero-structure crystal so that it can generate a laser beam of improved optical property.

2 Claims, 18 Drawing Figures

HETERO-STRUCTURE INJECTION LASER

This invention relates to hetero-structure lasers and more particularly to a semiconductor laser having excellent optical properties and a method of fabricating such a laser.

It is commonly known that the advent of double hetero-structure junction lasers has enabled one to reduce remarkably the threshold current density required for lasing and to realize continuous wave operation at room temperature. The term "double hetero-structure" refers to such a structure in which an active layer in the form of, for example, a layer of p-type GaAs is sandwiched between an n-type GaAlAs layer and a p-type GaAlAs layer to form a pair of heterojunctions therebetween. A structure in which an active layer in the form of a layer of $Ga_{1-y}Al_yAs$ is sandwiched between layers of $Ga_{1-x}Al_xA$ ($y < x$) includes also a pair of heterojunctions.

In a laser fabricated from a crystal having such a structure, the electrons and holes injected into the active layer during operation cannot advance any further and are confined within the active layer since the advancing movement thereof is obstructed by the potential barriers established by the outer layers having a large band gap. Thus, the radiative recombination of the electrons and holes can be effectively attained in such a laser structure. Further, the light produced by the recombination above described is confined within the active layer due to the fact that the index of refraction of the active layer is higher than those of the layers disposed on opposite sides of the active layer. Confinement of the carriers and light within the active layer leads to a remarkable reduction of the threshold current density required for lasing. Due to the above manner of operation, a double hetero-structure laser can emit a laser beam with a threshold current density which is far lower than those of conventional homojunction lasers and single hetero-structure lasers.

However, a laser structure in which electrodes are merely deposited on opposite end faces of a double hetero-structure crystal emits a laser beam which is not satisfactory in its monochromacity and coherency due to the presence of minute non-uniformity of the crystal structure. In an effort to overcome such a defect, a stripe-geometry laser has been proposed. (J. C. Dyment et al., J. Appl. Phys., Vol. 40, page 1802, 1969) This laser has a structure as described below. An electrical insulator layer is coated on one surface of a double hetero-structure crystal, a narrow stripe portion of this insulator layer being removed by etching in a direction perpendicular to the cleavage plane of the crystal, and a metal layer is evaporated on the insulator layer to be in contact with the crystal surface at the narrow stripe portion above described. With such a structure, current flows in stripe form through the active layer during operation of the laser, resulting in a reduction of the lasing area. Thus, this laser emits a laser beam of better optical properties than when current flows through the entire active layer. On the other hand, an attempt to narrow the width of the stripe electrode in contact with the crystal surface in this laser structure results in an undesirable increase of the threshold current density required for lasing. This is attributable to the fact described below. The current flowing through the active layer in stripe form has an intensity distribution in the transverse direction such that the current density is lowest at portions adjacent to the opposite ends in the transverse direction of the stripe. Thus, the current in these portions does not contribute to the lasing operation and is ineffective for producing a laser beam because of the low current density. The narrower the width of the stripe electrode, the greater is the degree of divergence of the current in the active layer, and a larger current is required for the lasing operation due to the increase of wastefully lost current portions. The inventors have proposed a mesa-stripe-geometry laser in an effort to eliminate undesirable losses due to such divergence of current. (This laser is disclosed in U.S. patent application Ser. No. 277,270, abandoned, and British patent application Ser. No. 36040/72.) This laser has a structure such that a narrow stripe mesa is formed by etching to remove portions of a crystal until the crystal portions are etched to a depth beyond the depth of an active layer so that the active region can be included in the narrow stripe mesa. According to this structure, current flows substantially uniformly through the active region without giving rise to undesirable losses as above described and this laser can lase with a very low threshold current density in spite of the fact that the width of the stripe is narrowed. However, the laser of this structure has not been fully satisfactory for emitting a laser beam of a single mode and a laser beam having a satisfactory polarization as will be apparent from experimental results described later.

It is therefore a primary object of the present invention to provide a novel and improved semiconductor laser which can operate with a low threshold current density and can produce a laser beam of a single mode and having a high degree of polarization with a wide current range.

Another object of the present invention is to provide a semiconductor laser which can emit a laser beam with high power such that it can be easily utilized for light communications by virtue of the fact that it can dissipate heat efficiently and has the improved properties above described.

A further object of the present invention is to provide a semiconductor laser which is mechanically stable and is capable of continuous wave operation at room temperature.

Another object of the present invention is to provide a method of fabricating such a laser.

In accordance with one aspect of the present invention, there is provided a semiconductor laser pellet comprising a multi-layered semiconductor crystal including therein at least one heterojunction and a laser active layer adjacent to said heterojunction, a surface of said crystal parallel to said heterojunction being mesa-etched leaving said active layer unetched to form a narrow stripe mesa above said active layer, said stripe mesa being perpendicular to the parallel end faces of said crystal, each of said end faces having a reflecting face for a laser beam produced in said active layer, a first conductive layer coated on the surface of said stripe mesa, and a second conductive layer coated on the surface of said crystal opposite to said stripe mesa.

It will be apparent from the above description of one form of the present invention that the present invention is featured by the fact that the crystal layers overlying the active layer are solely subjected to mesa etching and no mesa etching is applied to the active layer. According to this structure, current injected from the mesa formed thereabove flows into the active layer in a diverging fashion, but the degree of current divergence is far less than in the case of the conventional stripe-geometry laser due to the fact that the mesa is in direct contact with the active layer. The divergence of current is very slight even when the mesa formed on the active layer has a narrow width of the order of 10μ. Thus, the laser according to the present invention can produce a laser beam with a low threshold current density comparable to that for the conventional mesa-geometry laser. Further, according to the structure of the present invention in which no mesa etching is applied to the active layer, there is a very slight difference between the index of refraction of the active layer portion in which current flows to produce the laser beam and the index of refraction of the active layer portion in which no current flows. In contrast, in the conventional mesa-geometry laser in which the active layer is subjected to mesa etching, there is a great difference between the indices of refraction due to the fact that the side faces of the active layer producing the laser beam are in contact with air or insulating film. As will be apparent from experimental results described later, the slight difference between the indices of refraction in the structure according to the present invention exerted a good influence on the optical properties of the laser and facilitated the emission of the laser beam of single mode and having a high degree of polarization. Further, in the structure according to the present invention, a lasing region in stripe form, hence a linear heat source, is formed in the active layer. Thus, when this laser is connected to a heat sink, hence when the linear heat source is connected to the heat sink, heat can be efficiently dissipated so that the laser can operate with a large current.

Other objects, features and advantages of the present invention will be apparent from the following detailed description of some preferred embodiments thereof taken in conjunction with the accompanying drawings. In the drawings in which like reference numerals are used to denote like parts:

Figure 1:
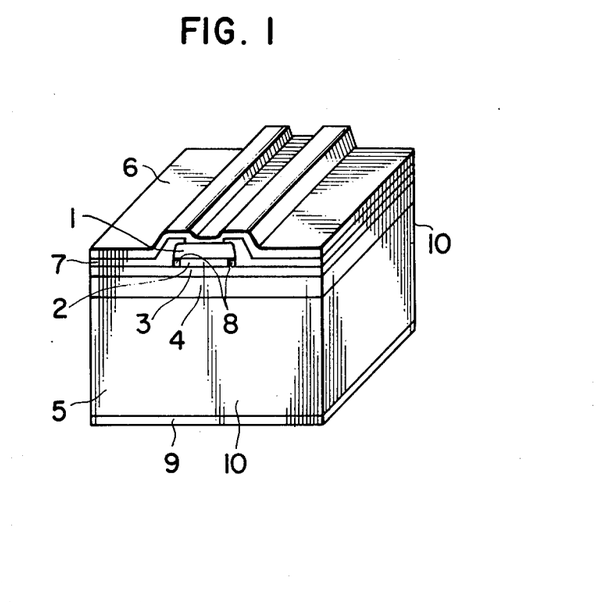
FIG. 1 is a schematic perspective view of an embodiment of the laser pellet according to the present invention.

Referring to FIG. 1 showing schematically an embodiment of the semiconductor laser pellet according to the present invention in perspective view, an evaporated metal layer 9 is deposited on one surface of a crystal consisting of a p-type GaAs layer 1, a p-type GaAlAs layer 2, a p-type GaAs layer (active layer) 3, an n-type GaAlAs layer 4 and an n-type GaAs substrate 5. An electrical insulator layer 7 which may be a phosphosilicate glass layer is deposited on the crystal surface remote from the surface on which the metal layer 9 is deposited, and an evaporated metal layer 6 is deposited on the insulator layer 7. The layers 1 and 2 are mesa-etched to leave a narrow stripe mesa. A pair of spaces 8 are formed on opposite sides of the layer 2 during selective etching on the layer 2 described later. Further, a stripe portion of the insulator layer 7 overlying the layer 1 is removed by a photo-resist etching technique and the metal layer 6 is in contact with the layer 1 at this stripe portion. The evaporated metal layers 6 and 9 serve as electrode layers.

Figure 2:
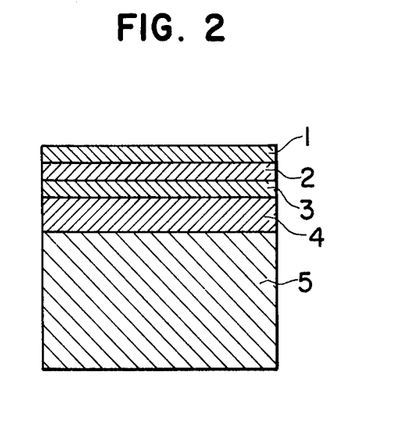
FIG. 2 is a schematic vertical section of a double hetero-structure crystal used in the embodiment shown in FIG. 1.

The semiconductor pellet having the above structure is fabricated in a manner as will be described below. Referring to FIG. 2 showing in schematic vertical section the structure of a double hetero-structure crystal used in the above embodiment, an n-type $Ga_{0.7}Al_{0.3}As$ layer 4 (wherein the dopant is Te), a p-type GaAs layer 3 (wherein the dopant is Si), a p-type $Ga_{0.7}Al_{0.3}As$ layer 2 (wherein the dopant is Zn) and a p-type GaAs layer 1 (wherein the dopant is Zn) are successively grown on an n-type GaAs substrate 5 by a liquid phase epitaxy method. Zinc is diffused from one of the surfaces of the crystal to a depth of about 0.7μ to form a $p^+$-type layer in the crystal surface. A phospho-silicate glass layer 11 is then deposited on the surface of the layer 1 by a chemical vapor deposition method.

Figure 3A:
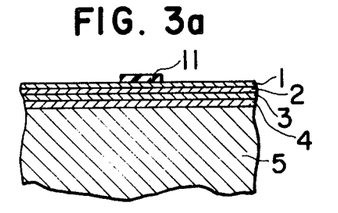
FIGS. 3a, 3b, 3c, 3d, 3e and 3f are schematic sectional views showing successive steps for the fabrication of the embodiment shown in FIG. 1.
Figure 3B:
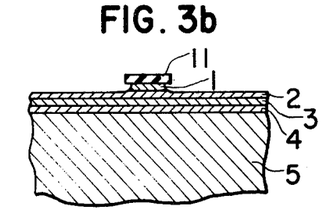

Referring to FIGS. 3a to 3f showing in detail the successive steps for the fabrication of the laser structure in schematic vertical section, photo etching is applied to the phospho-silicate glass layer 11 so as to leave a stripe portion which has a width of, for example, 13μ, 20μ or 40μ and which extends in a direction perpendicular to the cleavage plane of the crystal as shown in FIG. 3a. This cleavage plane is the (110) plane in this embodiment. The crystal surface having the stripe of the phospho-silicate glass layer 11 thereon is then subjected to mesa etching by an etchant which may be a 4:1:1 mixture of $H_2SO_4$, $H_2O_2$ and $H_2O$ until the exposed portions of the layer 1 are completely removed and portions of the layer 2 are slightly removed. The period of time required for etching is 1 minute and a fraction thereof when the thickness of the layer 1 is 2μ although this period of time varies depending on the thickness of the layer 1. FIG. 3b shows the state of the crystal after the step of etching with this etchant. This crystal is then immersed in an etchant which may be a 1:1 mixture of HF and $H_2O$ so as to etch away the exposed portions of the p-type $Ga_{0.7}Al_{0.3}As$ layer 2.

Figure 3C:
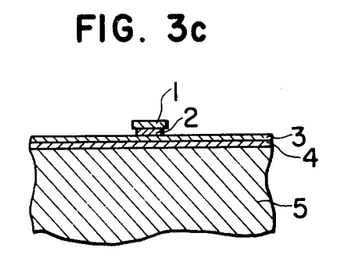

GaAlAs is etched by hydrofluoric acid or dilute hydrofluoric acid, but GaAs is not etched by such acid at all. Thus, no etching occurs in the p-type GaAs layer 3 which is the active layer and this layer 3 remains unetched. During etching with this etchant, the layer 2 in the stripe mesa is subjected to side etching to provide a structure in which the crystal layer 1 overhangs the underlying layer 2. The layer 11 is also removed by the same etchant. FIG. 3c shows the state of the crystal after the step of etching with the etchant consisting of HF and H$_2$O. The structure in which the crystal layer 1 overhangs the underlying layer 2 provides such an advantage that the surface which can be utilized for depositing an electrode 6 on the crystal layer 1 in a later step of selective evaporation of metal has a width larger than the effective width of the active region of stripe pattern and fabrication can thereby be facilitated.

Figure 3D:
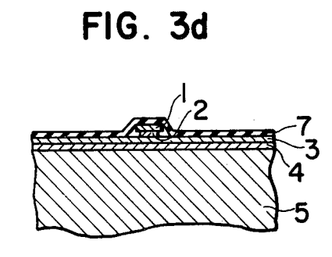
Figure 3E:
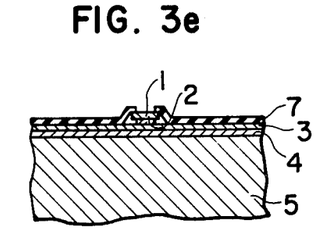
Figure 3F:
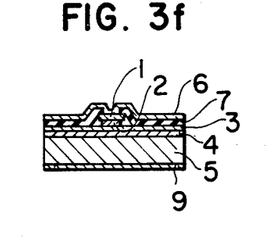

An electrical insulator 7 which may be phospho-silicate glass is deposited again on the mesa side surface of the crystal having the above-mentioned structure as shown in FIG. 3d. A stripe portion of this phospho-silicate glass film 7 covering the crystal layer 1 is selectively removed as shown in FIG. 3e. The width of the removed portion of the insulator film 7 was selected to be 4μ, 10μ or 30μ when the width of the stripe mesa portion was 13μ, 20μ or 40μ respectively. The crystal must have a substantial thickness (about 400μ in the present embodiment) in order that it can be subjected to the etching steps including the step of photo etching described hereinbefore. After the step shown in FIG. 3e, the substrate side surface of the crystal is lapped to reduce the overall thickness of the crystal to about 100μ. The p$^+$-type layer formed in the substrate side surface of the crystal by the zinc diffusion treatment is also removed by this lapping treatment. Metal layers are then evaporated on the opposite surfaces of the crystal. More precisely, a metal layer 6 consisting of a chromium layer about 0.1μ thick and a gold layer about 1μ thick is evaporated on the mesa side crystal surface having the phospho-silicate glass film 7 thereon, and another metal layer 9 of gold-germanium-nickel system is evaporated on the substrate side surface of the crystal so that these metal layers 6 and 9 serve as electrodes. The crystal is then clove in a direction perpendicular with respect to the stripe to obtain a crystal piece which has a longitudinal width of about 300μ, and then this crystal piece is scribed in parallel with the stripe on opposite sides of the center line of the stripe to provide a transverse width of about 200μ to 250μ. In this manner, a laser pellet as shown in FIG. 3f is obtained. This laser pellet is mounted on a suitable stem to obtain a laser diode.

In the fabricating steps above described, an etchant which is a 4:1:1 mixture of H$_2$SO$_4$, H$_2$O$_2$ and H$_2$O is used to etch the GaAs layer 1 and a portion of the GaAlAs layer 2, and then another etchant which is a 1:1 mixture of HF and H$_2$O is used to selectively etch the remaining portions of the GaAlAs layer 2. However, etching steps as described below may be employed in lieu of the steps above described. This alternative steps include removing the GaAs layer 1 by the use of an etchant which etches away the surface layer 1 of GaAs but does not substantially etch the GaAlAs layer 2, and then removing the GaAlAs layer 2 by the use of an etchant such as hydrofluoric acid referred to above which etches away GaAlAs but does not etch GaAs. A pellet similar to that above described can be obtained by the fabricating steps including these alternative etching steps. A 1:40:40 mixture of HF, H$_2$O$_2$ and H$_2$O is an example of the etchant which etches away GaAs but does not substantially etch GaAlAs. The ratio between the etching rate V(GaAs) of this etchant against GaAs and the etching rate V(GaAlAs) of this etchant against GaAlAs is 3:1. Due to the fact that this etchant does not substantially etch the GaAlAs layer 2 even after it etches away the overlying GaAs layer 1, this etchant is advantageous over the etchant containing H$_2$SO$_4$ since the latter etchant may etch the GaAs layer 3 additionally after the removal of the GaAs layer 1 and GaAlAs layer 2.

Figure 4:
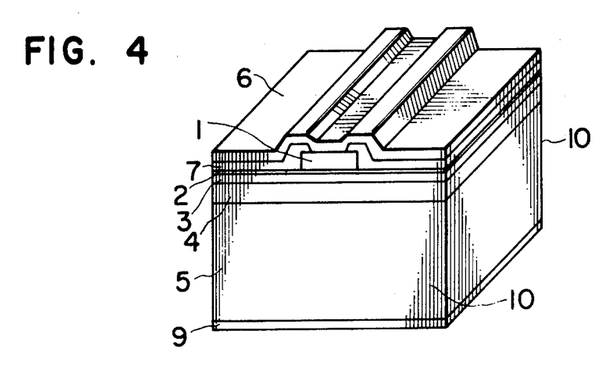
FIG. 4 is a schematic perspective view of another embodiment of the laser pellet according to the present invention.

The etchant which etches the surface layer selectively can be utilized for fabrication of another embodiment of the present invention. Referring to FIG. 4 showing schematically another embodiment of the present invention in perspective view, a layer 2 in a double hetero-structure crystal is grown to have an extremely small thickness during formation of various layers 4, 3, 2 and 1 on a substrate 5 by liquid phase epitaxial growth. More precisely, this layer 2 has a thickness less than 0.5μ. This thin layer 2 is not substantially etched away during mesa etching on the layer 1 of the crystal by the selective etching solution for removing substantial portions of the layer 1 to obtain a narrow stripe mesa. A phosphosilicate glass layer 7 and metal layers 6 and 9 are then deposited on this crystal as in the preceding embodiment. This crystal is then clove and scribed to obtain a laser pellet. Due to the fact that the layer 2 interposed between the stripe mesa and the active layer 3 in this embodiment is extremely thin, current flowing into the active layer 3 from the stripe mesa during lasing operation of this laser diverges in a lesser degree. Thus, this laser could produce a laser beam with a low threshold current density.

Figure 5:
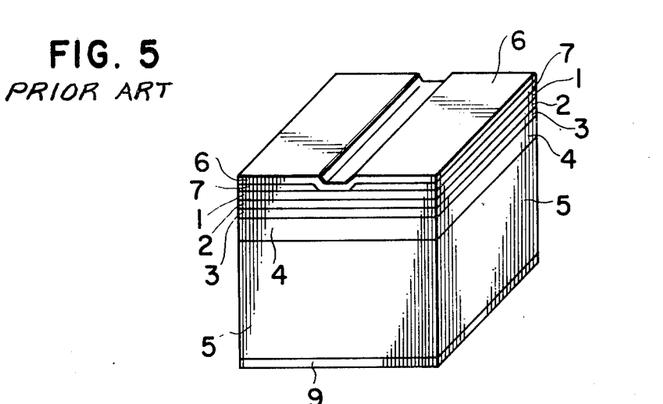
FIG. 5 is a schematic perspective view of a prior art stripe-geometry laser.

In an experiment in which the layer 1 of a commonly employed double hetero-structure crystal including the underlying layer 2 having a thickness of the order of 1μ was solely subjected to mesa etching, a large degree of current divergence was observed in the active layer 3 and an increase in the threshold current density was encountered as in the case of a prior art stripe-geometry laser. FIG. 5 is a schematic perspective view of such a prior art stripe-geometry laser. It will be apparent from FIG. 5 that current flowing into an active layer 3 from a stripe portion of a metal layer 6 in contact with a semiconductor layer 1 diverges greatly in the active layer 3 due to the presence of layers 1 and 2 therebetween and an increase in the threshold current density results as referred to above. In contrast, in the embodiment of the present invention shown in FIG. 4, any appreciable current divergence does not occur in the active layer 3 and the threshold current density is also low as in the embodiment shown in FIG. 1 by virtue of the fact that the layer 2 interposed in the path of current flowing from the stripe mesa 1 into the active layer 3 is so thin that it is almost negligible.

The stripe mesa in the two embodiments above described can also be formed by sputtering although the foregoing description has referred to formation of such stripe mesa by mesa etching with chemicals. More precisely, a sharp stripe mesa can be formed by depositing a photo-resist film in narrow stripe form on one surface of a double hetero-structure crystal and applying to this surface the RF sputtering described in an article of Journal of Electrochemical Society, Vol. 116, No. 1, pages 100–103, 1969. Further, etching can be applied to the desired semiconductor layer by extracting gas components from within the discharge space during this sputtering process, analyzing the gas components to detect the appearance and disappearance of a specific component such as aluminum, and stopping the discharge. However, this method requires bulky equipment and the production efficiency is not so high.

The two embodiments above described provide a laser structure in which a narrow stripe mesa contributing directly to the emission of a laser beam is solely formed on one surface of a double hetero-structure crystal. However, the present invention is in no way limited to such embodiments and provides further a laser structure in which any desired portions except the narrow stripe mesa are also left unetched on the crystal surface during mesa etching and a layer of electrical insulator is coated to cover all these surface portions.

Figure 6:
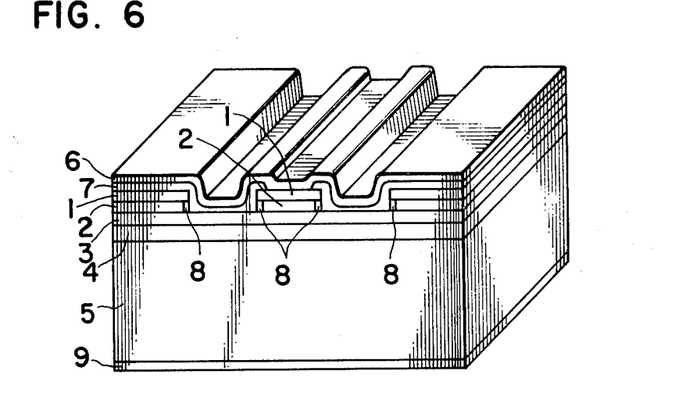
FIG. 6 is a schematic perspective view of a further embodiment of the laser pellet according to the present invention.

FIG. 6 is a schematic perspective view showing such an embodiment of the present invention. It will be apparent from FIG. 6 that mesa etching is applied to layers 1 and 2 of a double hetero-structure crystal consisting of various layers 1, 2, 3, 4 and 5 so as to form a pair of mesas on opposite sides of a central narrow stripe mesa in isolated relation from one another. A layer 7 of electrical insulator or phosphosilicate glass is deposited on the crystal surface and a limited portion of this insulator layer 7 above the central stripe mesa is solely removed in stripe form. Thus, an evaporated metal layer 6 is in contact with the semiconductor layer 1 solely at the position of the central stripe mesa and is electrically insulated from the mesas disposed on opposite sides of the central stripe mesa. Therefore, the central stripe mesa is soley effective in producing a laser beam. This laser structure makes lasing operation in a manner similar to the structure shown in FIG. 1. However, when this laser structure is combined with a heat sink or means such as a combined heat sink and optical wave guide, a combination which is mechanically very stable can be obtained due to the fact that this embodiment includes the mesa portions in addition to the central stripe mesa on the crystal surface. Further, although the laser structure of FIG. 6 is shown having a pair of insulated mesa portions disposed on opposite sides of a central stripe mesa contributing to lasing operation, a laser structure including a single insulated mesa portion or a plurality of such mesa portions can also be combined with a heat sink to provide a mechanically stable combination.

In FIGS. 1, 4 and 6 illustrating the embodiments of the present invention, the stripe mesa contributing to the emission of a laser beam is invariable in the form of a straight stripe. However, a laser structure having a mesa of slightly curved contour can also produce a laser beam similarly effectively. This is attributable to the fact described below. In the present invention, a portion effective in passing current and an ineffective portion outside of the effective portion are formed in the active layer as described hereinbefore. The indices of refraction of the effective and ineffective portions of the active layer differ slightly from each other due to the difference between the carrier densities. Confinement of light can be attained by this difference between the indices of refraction. A curved mesa provides a curved current path in the active layer, and due to the above light confining effect, the light produced by the radiative recombination of carriers propagates along the curved portions of the active layer so as to travel back and forth between the reflecting faces. It is to be noted that the opposite ends of the curved mesa must be perpendicular to the reflecting faces or cleavage plane in order to minimize wasteful losses of the light reflected by the reflecting faces and to ensure successful emission of the laser beam.

Figure 7:
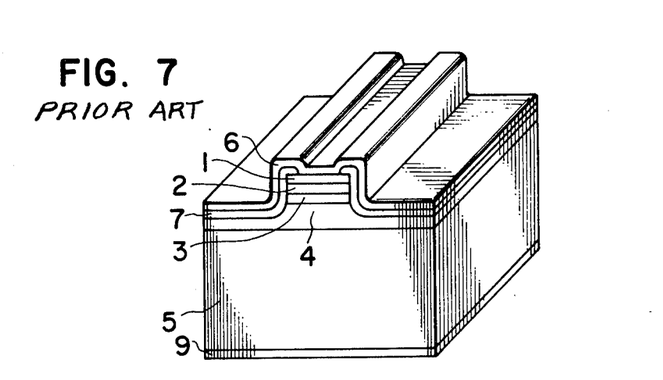
FIG. 7 is a schematic perspective view of a prior art mesa-stripe-geometry double hetero-structure laser (HMS laser)

The properties of the laser according to the present invention will now be described in detail while comparing same with those of prior art lasers. A prior art mesa-stripe-geometry laser as shown in FIG. 7 in perspective fashion will be referred to hereinafter as an HMS (high mesa stripe) laser since it includes a stripe mesa consisting of layers 1, 2, 3 and 4. The laser according to the present invention will be referred to hereinafter as an LMS (low mesa stripe) laser since it includes a stripe mesa consisting of layers 1 and 2 or a single layer 1 as shown in FIG. 1 or 4.

Figure 8:
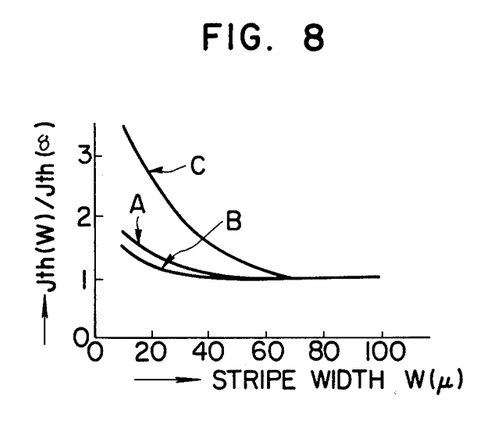
FIG. 8 is a graph showing the threshold current density relative to the stripe width of the prior art lasers and the laser according to the present invention.

FIG. 8 is a graph showing the relation between the width of the stripe and the threshold current density required for lasing, and this graph is based on the results of an experiment made by the inventors. The curves A, B and C in FIG. 8 represent the threshold current density for the LMS laser according to the present invention, that for the prior art HMS laser having a structure as shown in FIG. 7, and that for the prior art stripe-geometry laser having a structure as shown in FIG. 5 respectively. It will be seen from FIG. 8 that the threshold current density for the LMS laser according to the present invention increases only slightly with the decrease of the width of the stripe. Although the rate of increase of the threshold current density for the LMS laser does not appreciably differ from that for the prior art HMS laser shown in FIG. 7, it is far less than that for the prior art stripe-geometry laser shown in FIG. 5. It will thus be understood that the laser according to the present invention is capable of lasing operation with a low threshold current density comparable to that for the prior art HMS laser in spite of the fact that the width of the stripe mesa is quite narrow. The vertical axis in FIG. 8 represents the ratio between the threshold current density $J_{th}(W)$ which is a function of the width W of the stripe mesa and the threshold current density $J_{th}(\infty)$ required when the stripe width is sufficiently large.

Figure 9:
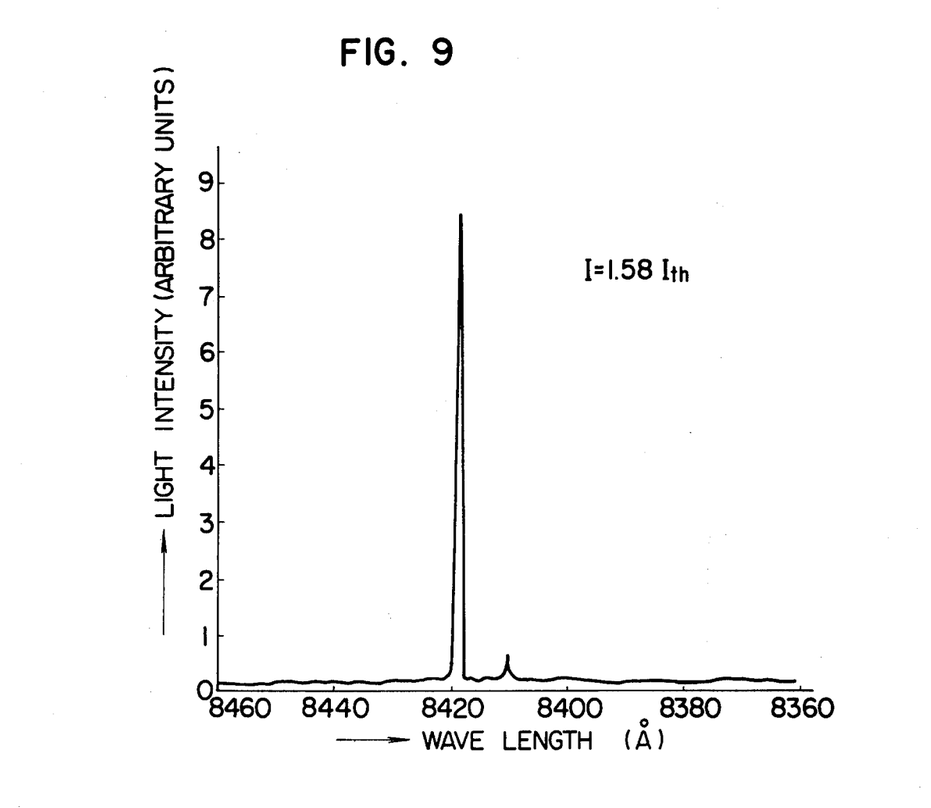
FIG. 9 is a spectral diagram showing the emission spectrum of the laser according to the present invention.
Figure 10:
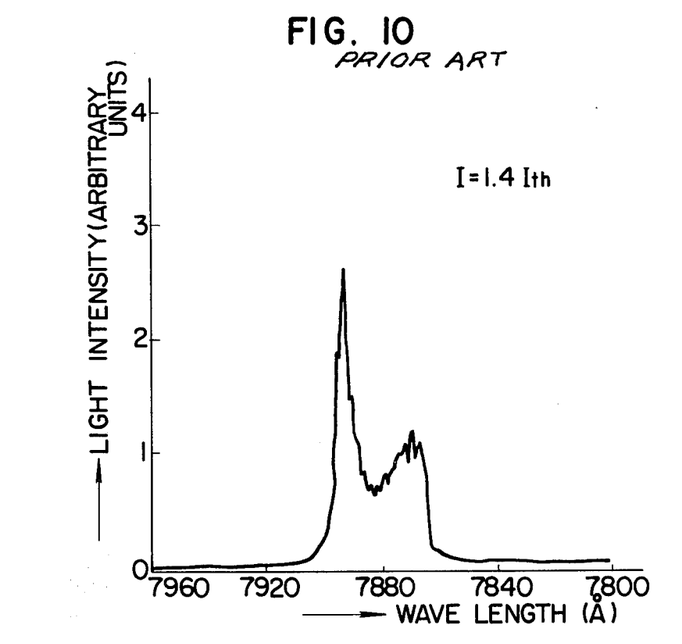
FIG. 10 is a spectral diagram showing the emission spectrum of the prior art HMS laser.

FIG. 9 is a spectral diagram showing an example of the spectrum of the laser beam emitted from the laser according to the present invention. FIG. 9 represents the case in which a current whose density is 1.58 times the threshold current density $J_{th}$ is supplied to the laser. It will be apparent from FIG. 9 that the laser lases substantially with a single mode in response to the supply of such current and the emission spectrum includes merely a small spurious peak on the short wavelength side. FIG. 10 is a spectral diagram showing an example of the spectrum of the laser beam emitted from the prior art HMS laser and represents the case in which a current whose density is 1.4 times the threshold current density is supplied to the laser. It will be seen from FIG. 10 that the spectrum of the laser beam emitted from this prior art laser is quite complex and a multi-mode emission occurs apparently. Generally, the prior art HMS laser lases with a single mode when supplied with a current whose density is very close to the threshold current density, but a slight increase in the current value results in occurrence of a multi-mode emission. Some of the lasers according to the present invention can lase with a single mode even when supplied with a current whose density is two times the threshold current density. It will thus be understood that the laser according to the present invention can emit a laser beam of single mode within a current range which is far wider than the operating current range of the prior art HMS laser. An experiment was made by the inventors for investigating the polarization of the laser beam. It was proved that the laser beam emitted from the laser according to the present invention exhibited an excellent polarization.

Figure 11:
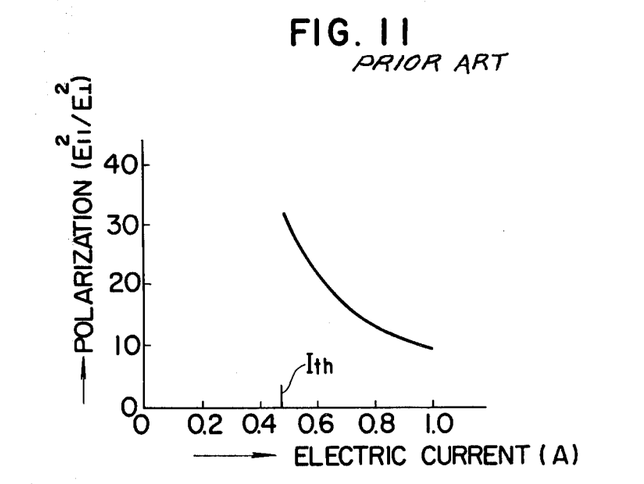
FIG. 11 is a graph showing the relation between the polarization and the current in the prior art HMS laser.
Figure 12:
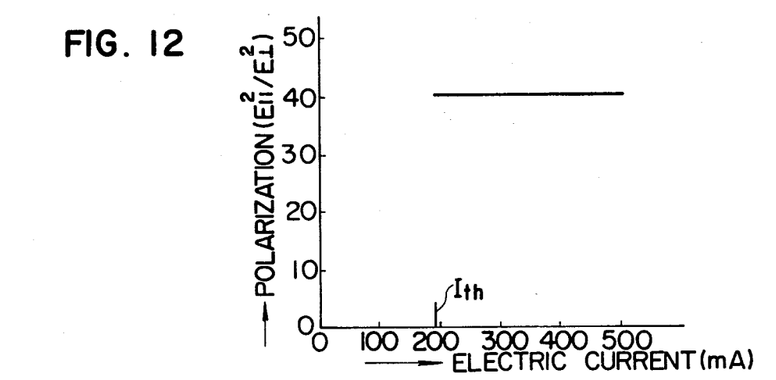
FIG. 12 is a graph showing the relation between the polarization and the current in the laser according to the present invention.

Generally, in a laser fabricated from a double hetero-structure crystal, the electric field vector of the laser beam is polarized substantially in parallel to the junction surface. An experiment was made to measure the polarization in terms of $E_\parallel^2/E_\perp^2$ where $E_\parallel$ and $E_\perp$ represent the field component parallel to the junction surface and the field component perpendicular to the junction surface, respectively. The results of the experiment are shown in FIGS. 11 and 12. FIG. 11 shows the relation between the polarization and the electric current in a prior art HMS laser. It will be seen from FIG. 11 that the polarization is reduced abruptly with the increase in the electric current supplied to the laser. FIG. 12 is a similar graph in the case of an LMS laser according to the present invention. It will be seen from FIG. 12 that the polarization of the laser beam emitted from the LMS laser of the present invention is almost free from any reduction even with the increase in the electric current supplied thereto.

It will be apparent from the results of various experiments above described that the laser according to the present invention is capable of laser beam emission with a low threshold current density comparable to that for the prior art HMS laser in spite of a narrow width of the stripe mesa and that a laser beam of single mode and having a satisfactory degree of linear polarization can be emitted even when the current supplied thereto is increased to a higher level than the threshold current level for increasing the laser beam output. The laser capable of continuously emitting an intense laser beam having improved optical properties at room temperature is indispensable to light communications and the like.

Figure 13:
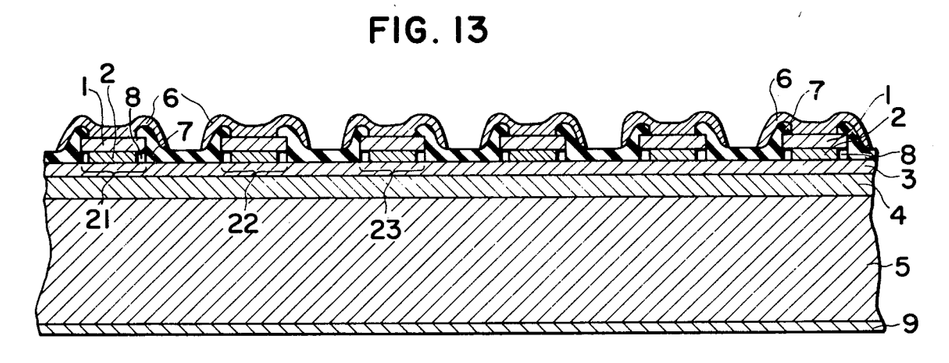
FIG. 13 is a schematic vertical section of a laser array according to the present invention.

According to the present invention, further, a plurality of lasers can be formed on a double hetero-structure crystal with a high rate of integration. FIG. 13 is a schematic vertical section of a one-dimensional laser array according to the present invention. Referring to FIG. 13, a plurality of stripe mesas 21, 22, 23, ... each including semiconductor layers 1 and 2 are formed on an active layer 3. In such a structure, the rate of integration is determined depending on the width of the mesas and the spacing between the mesas. The width of the mesas can be reduced by virtue of the fact that the laser structure according to the present invention is capable of continuous wave operation with a low threshold current density in spite of a narrow mesa width as described hereinbefore. Further, the spacing between the mesas can be reduced without giving rise to an undesirable interaction between the adjacent lasers by virtue of the fact that current does not appreciably diverge in the active layer 3. For these reasons, the present invention can provide a laser array having a high rate of integration and this laser array can emit a laser beam which is excellent in optical properties as described hereinbefore.

The embodiments of the present invention have been described and illustrated with reference to a structure employing a double hetero-structure crystal. It is apparent however that the same operation and features as those above described can be attained and exhibited even when the present invention is applied to a single hetero-structure crystal. While various embodiments of the present invention have been described in detail while comparing same with prior art lasers, it is apparent to those skilled in the art that many changes and modifications may be made therein without departing from the spirit of the present invention and the scope of appended claims.

We claim:

1. A hetero-structure injection laser pellet comprising:
   a multi-layered semiconductor crystal having a first major surface at one end thereof and a pair of side faces at opposite sides thereof, said crystal including:
   an active layer of one conductivity type which is sandwiched between a first layer of the one conductivity type and a second layer of the opposite conductivity type, said first and second layers being made of a semiconductor material different from that of said active layer thereby to form a pair of heterojunctions for generating a laser beam of a single mode produced when electric current passes through said active layer, said heterojunctions being parallel to one another, and an edge of the heterojunction between said active layer and said second layer extending and being exposed to said side faces of said crystal,
   parallel end faces, each of which reflects a laser beam produced in said active layer, and with respect to which said active layer is perpendicular at said end faces,
   a third layer of the one conductivity type disposed upon said first layer,
   a fourth layer of the opposite conductivity type adjacent to said second layer, said fourth layer having said first major surface at one end thereof, said third and fourth layers being made of the same semiconductor material as that of said active layer,
   wherein the minimum width of said first layer as measured in a direction between said side faces of said crystal is less than the width of said active layer between said side faces of said crystal, to substantially prevent divergence of said current applied thereto through said third layer, for confining said current to a restricted area of said active layer;
   an insulating layer coated on said third layer and protectively overlying the interface of said first layer and active layer, while a portion of the upper surface of said third layer is exposed in the form of a narrow strip along a direction perpendicular to said end faces of said crystal,
   a first electrode electrically connected to said first major surface of said crystal, and
   a second electrode electrically connected only to the exposed portion of the upper surface of said third layer, said current being applied through said first and second electrodes to said third and fourth layers.

2. A hetero-structure injection laser pellet comprising:
   a multi-layered semiconductor crystal having a first major surface at one end thereof and a pair of side faces at opposite sides thereof, said crystal including:
   an active semiconductor layer which is sandwiched between a first semiconductor layer and a second semiconductor layer, said first and second semiconductor layers having conductivity types different from each other and forming, with said active layer, a pair of respective heterojunctions for generating a laser beam of a single mode produced when electric current passes through said active layer, said heterojunctions being parallel to one another, and an edge of the heterojunction between said active layer and said second layer extending and being exposed to said side faces of said crystal, parallel end faces, each of which reflects a laser beam produced in said active layer, and with respect to which said active layer is perpendicular at said end faces, a third semiconductor layer disposed upon said first layer, a fourth semiconductor layer adjacent to said second layer, said fourth layer having said first major surface at one end thereof, wherein the minimum width of said first layer as measured in a direction between said side faces of said crystal is less than the width of said active layer between said side faces of said crystal, to substantially prevent divergence of said current applied thereto through said third layer, for confining said current to a restricted area of said active layer, an insulating layer coated on said third layer and protectively overlying the interface of said first layer and active layer, while a portion of the upper surface of said third layer is exposed in the form of a narrow strip along a direction perpendicular to said end faces of said crystal, a first electrode electrically connected to said first major surface of said crystal, and a second electrode electrically connected only to the exposed portion of the upper surface of said third layer, said current being applied through said first and second electrodes to said third and fourth layers.

* * * * *